(12) United States Patent
Sievers et al.

(10) Patent No.: US 6,730,237 B2
(45) Date of Patent: May 4, 2004

(54) FOCUSED ION BEAM PROCESS FOR REMOVAL OF COPPER

(75) Inventors: Michael R. Sievers, Holmes, NY (US); Steven B. Herschbein, Hopewell Junction, NY (US); Aaron D. Shore, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 09/887,791

(22) Filed: Jun. 22, 2001

(65) Prior Publication Data

US 2002/0195422 A1 Dec. 26, 2002

(51) Int. Cl.[7] .............................. C23F 1/00; C23C 14/34
(52) U.S. Cl. .............................. 216/62; 216/66; 216/78; 204/129.34
(58) Field of Search .............................. 216/62, 66, 78; 204/192.34

(56) References Cited

U.S. PATENT DOCUMENTS

| 4,416,725 A | * 11/1983 | Cuomo et al. ................ 216/78 |
|---|---|---|
| 4,490,211 A | * 12/1984 | Chen et al. ................... 216/62 |
| 4,622,095 A | * 11/1986 | Grobman et al. ............. 216/65 |
| 5,188,705 A | 2/1993 | Swanson et al. ........ 204/192.34 |
| 5,532,494 A | * 7/1996 | Kawanami et al. ...... 250/491.1 |
| 5,736,002 A | * 4/1998 | Allen et al. ................. 438/705 |
| 5,840,630 A | * 11/1998 | Cecere et al. ............... 438/712 |
| 6,083,413 A | * 7/2000 | Sawin et al. ................ 216/104 |
| 6,194,720 B1 | * 2/2001 | Li et al. ...................... 250/311 |
| 6,211,527 B1 | * 4/2001 | Chandler ................. 250/492.2 |
| 6,322,672 B1 | * 11/2001 | Shuman et al. ........ 204/192.34 |
| 2002/0072228 A1 | * 6/2002 | Kuo ............................ 438/669 |
| 2002/0094694 A1 | * 7/2002 | Russel et al. ............... 438/712 |

\* cited by examiner

*Primary Examiner*—Nadine G. Norton
*Assistant Examiner*—Shamim Ahmed
(74) *Attorney, Agent, or Firm*—Tiffany Townsend; Cantor Colburn LLP

(57) ABSTRACT

A process for milling copper metal from a substrate having an exposed copper surface includes absorbing a halogen gas onto the exposed copper surface to generate reaction products of copper and the halogen gas; removing unreacted halogen gas from the surface; and directing a focused ion beam onto the surface to selectively remove a portion of the surface comprising the reaction products.

11 Claims, 2 Drawing Sheets

FOCUSED ION BEAM PROCESS FOR REMOVAL OF COPPER

BACKGROUND OF THE INVENTION

Focused ion beam technology (FIB) utilizes an apparatus that focuses an ion beam from an ion source through a lens and irradiates the beam onto a sample. In the fabrication of integrated circuits, FIB is frequently used to mill away (etch) material by irradiating an ion beam of relatively high current onto the substrate. The focused ion beam can be directed to a very small point on a semiconductor device and then scanned, raster fashion, over a surface where material is to be removed. As an ion impinges on the semiconductor device surface, its momentum is transferred, resulting in the removal of one or more surface atoms according to a process called sputtering. By selecting a raster pattern of a given overall shape, for example a horizontal raster pattern, a correspondingly shaped area of surface material can be removed. Often several successive layers of a semiconductor device are removed in a given area in order to reach and possibly sever an underlying layer.

The rate and controllability of milling can be enhanced by injecting gases that preferentially mill particular materials, such as dielectric or conductive materials. Gases are injected near the surface of the semiconductor device during the milling process to increase the efficiency of removing a specific type of material. As the boundaries between different materials are traversed, the type of gas injected may be changed to conform to the requirements of the new material; that is, a different gas may be used for each material or class of materials. Such techniques can be used to selectively expose the integrated circuit structure for probing or examination, cut holes through power and ground planes, and to selectively sever conductors. For example, U.S. Pat. Nos. 5,188,705 and 5,376,791 to Swanson et al disclose the use of a focused ion beam for sputtering (etching) of semiconductor devices while directing iodine vapor toward the surface to enhance the removal of materials such as silicon and aluminum. See also U.S. Pat. No. 5,009,743 to Swann, which describes the use of dual ion guns in combination with injection of molecular iodine, and U.S. Pat. No. 4,226,666 to Winters et al. which describes etching employing electron-beam or ion-beam radiation and a noble gas halide such as $XeF_2$, $XeF_4$, $XeF_6$, $KrF_2$, $KrF_4$ and $KrF_6$. The use of $XeF_2$ with FIB for preferential etching of dielectric in semiconductor devices has become commonplace as the use of $XeF_2$ substantially increases the etching rate of dielectric relative to the etching rate of most metals so that conductors can be exposed rapidly and with less risk of electrostatic discharge damage.

For a number of well known reasons, integrated circuits are now transitioning from aluminum to copper interconnects as device generation goes beyond the 0.35 micron design rules. For preferential FIB etching of aluminum metal relative to dielectric, the use of fluorine, chlorine or iodine gas is typically used to increase the etching rate. However, it has been found that the use of halogens, in general, causes severe corrosion of copper surfaces due to the high reactivity of halogens with copper. Moreover, the use of FIB for removal of copper is more complicated relative to aluminum due to the presence of copper grains. Current FIB processes for removal of copper result in the redeposition of copper.

SUMMARY OF THE INVENTION

A process for milling copper metal from a substrate having an exposed copper surface includes absorbing a halogen gas onto the exposed copper surface to generate reaction products of copper and the halogen gas; removing unreacted halogen gas from the surface; and directing a focused ion beam onto the surface to selectively remove a portion of the surface comprising the reaction products. Preferably, unreacted halogen gases are removed from the exposed copper metal surfaces by an electron beam scan. The beam current of the focused ion beam is preferably from about 500 to 3,000 picoAmps. In a preferred embodiment, iodine is absorbed directly onto the exposed copper surfaces.

A process for focused ion beam milling multiple layers of a substrate, wherein the substrate comprises an insulating layer in contact with an underlying copper surface includes exposing the substrate to a noble gas halide within an enclosed chamber; directing a focused ion beam onto a portion of the insulating layer and removing the portion to expose the underlying copper surface; absorbing a halogen gas onto the exposed copper surface to generate reaction products of copper and the halogen gas; removing unreacted halogen gas from the surface; and directing a focused ion beam onto the surface to selectively remove a portion of the surface comprising the reaction products.

Other advantages and a fuller understanding of the invention will be had from the accompanying drawings and detailed description that follows.

DETAILED DESCRIPTION OF PREFERRED EMBODIMENTS

Figure 1:
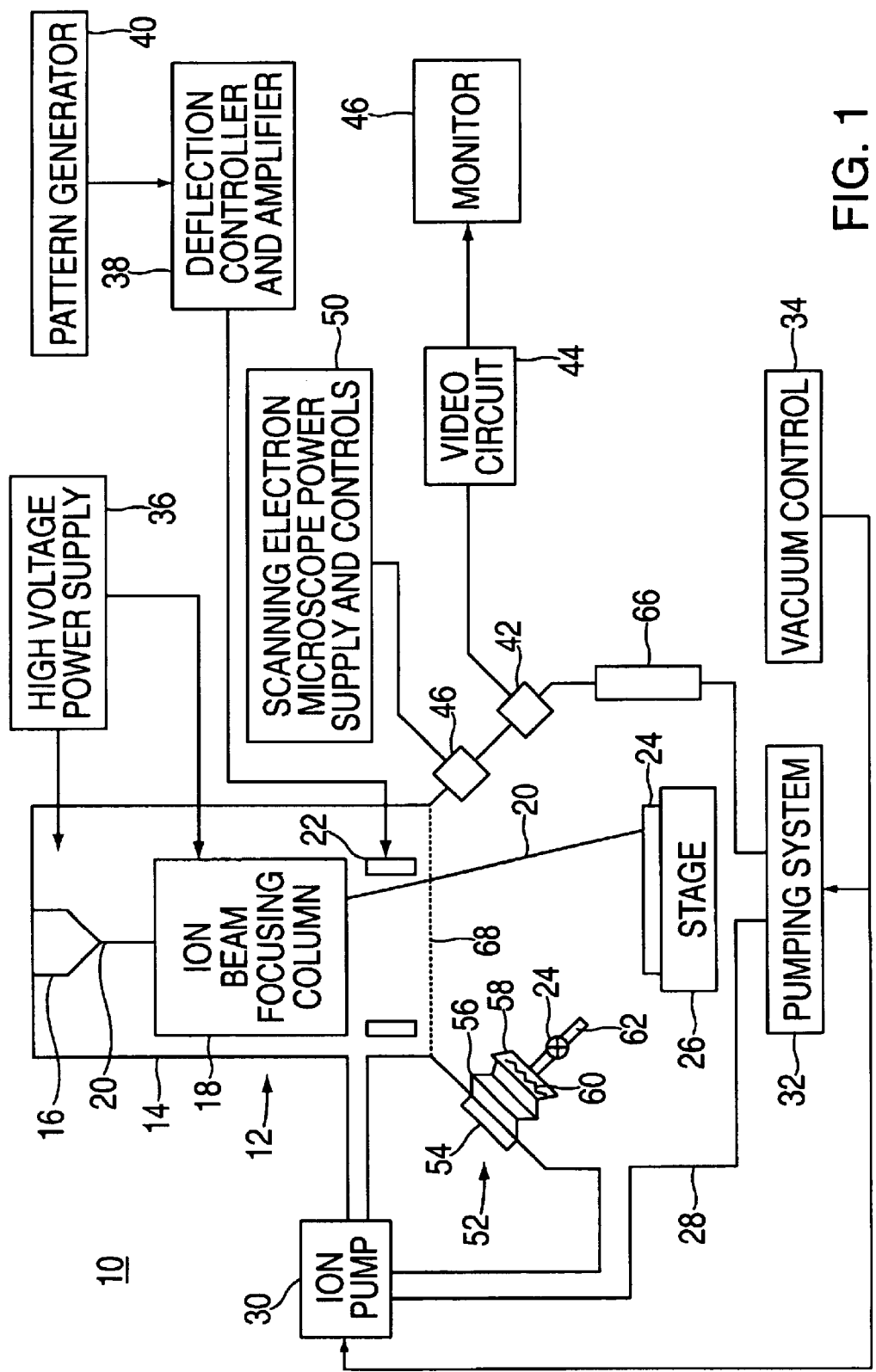
FIG. 1 is schematic diagram of a focused ion beam system.

A focused ion beam process for removing copper includes exposing a substrate including an exposed copper surface to a halogen gas enabling a chemical reaction between the halogen gas and the copper to form at the copper surface. Unreacted halogen gas is then removed from the surface and a focused ion beam is directed toward the surface for selective removal, through sputtering, of a portion of the surface comprising the reaction products of the halogen gas and copper. Advantageously, the process cleanly and anisotropically removes copper from the substrate. Moreover, the process effectively prevents redeposition of copper.

In particular, the FIB process for selectively milling copper from a substrate includes exposing a mill box containing an exposed copper surface to a halogen gas for a period of time effective to enable a chemical reaction between the halogen gas and the copper. Excess or unreacted halogen gas is then removed from the surface in the vicinity of the mill box by exposing the surface to an electron beam scan. The electron beam scan is continued and repeated until the unreacted halogen is removed from the surface. Energy dispersive X-ray spectrometry is employed to determine the amount of halogen within the mill box area. A focused ion beam is then generated and is directed toward the copper surface, for example, by rastering the beam over a defined mill area.

The energy of the ion beam is typically between 30 keV and 50 keV, although ion beam energies less than 30 keV could be used. Ion beam energies less than 30 keV result in less sputtering than higher energy ions, thereby reducing the non-selective removal of material and increasing the contribution of the gas to the removal of surface material. Skilled persons can readily adjust the etch time, gas flow, and ion beam characteristics to suit the particular materials and size of the cross section being exposed.

The focused ion beam mills copper from the substrate through sputtering of a portion of the surface comprising the reaction products of halogen and copper. Preferably, the ion-beam milling step is for a period of time effective to remove the surface defined by the reaction products in a mill box. Preferably, the ion beam milling process is for a period of about two minutes. Preferably, a beam current, which will vary with the size of the cross section, is from about 500 to 3,000 picoAmps.

The halogen gas is preferably in the gas phase at or near room temperature and at the pressures present in the focused ion beam vacuum chamber. The halogen gas preferably combines with the copper to produce compounds that will not remain on the surface of the substrate during ion beam milling, i.e., exposure to the focused ion beam cause the compounds to volatize. The focused ion beam reaction products migrate into the vacuum chamber 28 and are subsequently removed by vacuum. Preferred halogen gases include Group VII elements of the periodic table such as chlorine, iodine and fluorine. More preferably, the halogen gas is iodine, wherein the iodine is supplied as a vapor.

As the halogen gas or vapor is directed toward the surface of a substrate (e.g., substrate 24 in FIG. 1), halogen gas or vapor is adsorbed onto the copper surface enabling a chemical reaction to take place between halogen gas and the copper. As the focused ion beam scans this surface, the reaction product of the halogen gas and copper is removed, for example if the halogen is iodine, copper iodide (CuI) is removed.

In the course of removal of copper by sputtering it is desirable to provide sufficient halogen gas to the surface to form at least a saturated monolayer before impingement of the ion beam. Any excess halogen is removed prior to milling such as by electron beam scanning. The gas assisted physical sputtering of copper is very selective and allows accurate machining of desired areas without affecting the surrounding areas. Furthermore, the absence of copper redeposition is observed. Thus, rapid and accurate machining of surfaces including copper conductors in integrated circuit devices is selectively carried out in accordance with the present invention.

Referring now to FIG. 1, there is depicted a focused ion beam system suitable for carrying out the present invention and generally designated reference numeral 10. The invention is not limited to any particular focused ion beam systems in this or in the following embodiments. Focused ion beam systems particularly suitable for use are systems having gas assisted capabilities.

The system includes an evacuated envelope 12 having an upper portion 14 within which are located a liquid metal ion source 16 and a focusing column 18 which includes extractor electrode means and an electrostatic optical system. Ion beam 20 passes from the liquid metal source 16 through column 18 and between electrostatic deflection means, schematically indicated at 22, toward a substrate 24, which suitably comprises a semiconductor device positioned on a stage 26 within chamber 28. An ion pump 30 is employed for evacuating the upper portion 14. The chamber 28 is evacuated, preferably with a turbomolecular and mechanical pumping system 32 under the control of vacuum controller 34. High voltage power supply 36 is connected to the liquid metal ion source 16 as well as to appropriate electrodes in the ion beam focusing column 18 for forming an ion beam 20 and directing the same downwardly. Deflection controller and amplifier 38, operated in accordance with a prescribed pattern, such as a raster pattern, provided by pattern generator 40, is coupled to deflection plates 22 whereby ion beam 20 may be controlled to trace out a corresponding pattern on the upper surface of substrate 24.

The metal source 16 typically provides a metal ion beam of gallium (although other metallic ions can be used, for example indium or aluminum). The source is capable of being focused into a sub-0.1 micron width beam at substrate 24. An electron multiplier 42 used for detecting secondary emission for imaging is connected to a video circuit and amplifier 44, the latter supplying the drive for video monitor 46 also receiving deflection signals from deflection controller and amplifier 38. The evacuated envelope 12 preferably also includes a scanning electron microscope (SEM) 46 that can be used to view the results of operations performed by the focused ion beam, or more preferably, that can perform electron beam processing. SEM 46 includes an electron beam generator 48 and an associated power supply and controls 50.

A gas source 52 is located inwardly of the side of chamber 26 by a translation device 54 adapted for positioning the source 52 via support means within bellows 56. Bellows 56 accommodates movement of the nozzle assembly and reservoir relative to the substrate 24 without affecting the vacuum within chamber 28. Gas source 52 includes a reservoir 58 and a heater 60, which may comprise a membrane type heater and which may be used for raising the temperature of a compound within reservoir 58 to a temperature for providing a suitable vapor pressure in accordance with art recognized practices. A transfer tube or nozzle 62 comprising a capillary tube provided by a hypodermic needle extends from reservoir 58 and is connected thereto via control valve 64 adapted for releasing gaseous vapor. The nozzle is extended and translated in orthogonal directions substantially perpendicular to its axis employing translation apparatus 54, so that gaseous vapor can be aimed directly toward a region on the top surface of substrate 24.

A door 66 is opened for inserting substrate 24 onto stage 26 which may be heated, and also for servicing the reservoir 58. The door is interlocked so that it cannot be opened if the temperature in reservoir 58 is substantially above room temperature. A gate valve, schematically illustrated at 68, is closed before door 66 can be opened to seal off the ion source and focusing column apparatus. Bellows 52 accommodates movement of the nozzle assembly and reservoir relative to the sample without affecting the vacuum within chamber 26.

The vacuum control system along with the heater of gaseous vapor source 46 are operated to provide an appropriate vapor pressure condition for establishing a gaseous vapor flux in chamber that is directed toward substrate 24 for selective etching. To establish a given gaseous flux, the reservoir 58 is heated to a predetermined temperature as is known by those skilled in the art.

The high voltage power supply 36 provides an appropriate acceleration voltage to electrodes in ion beam focusing column 18 for energizing and focusing ion beam 20. When the ion beam 20 strikes the substrate 24 having condensed gaseous vapor adhered thereupon, the ion beam 20 provides energy for initiating a reaction between the etch-enhancing gaseous compound and the substrate as well as for sputter etching selected areas of the substrate. Deflection controller and amplifier 38 causes the ion beam 20 to be deflected in a desired pattern wherein deflection of the ion beam 20 is at a rate slow enough for etching substrate 24. Considerations regarding deflection speed, loop time, etc. are well within the skill of those in the art.

EXAMPLES

Example 1

In this example, a 2 micron layer of tetraethylorthosilicate (TEOS) was first formed on a substrate having thereon a copper surface. TEOS was chosen to simulate an oxide coating typically employed in the production of integrated circuits. The substrates are then placed into a chamber of a FEI 835 dual beam FIB instrument commercially available from FEI Company. A mill box is defined in the substrate.

The left side of the mill box is exposed to a default mill process employing the use of xenon difluoride through the TEOS layer to expose the copper surface as determined by endpoint detection. A pre-mill dose of iodine is then done for 2 minutes to form a reaction layer of CuI. A 25 kV electron beam scan of the surface is performed until there is no evidence of excess (unreacted) iodine as evidenced by EDX (energy dispersive X-ray spectrometry). The copper region is then milled away with no evidence of unreacted iodine in the reaction area and very small amounts of copper in the TEOS region.

The right side of the mill box is exposed to a default mill process employing the use of xenon difluoride through the TEOS layer to expose the copper surface as determined by endpoint detection. A default mill process without the use of a gas vapor was used to remove the exposed copper. The same beam current and acceleration voltages were employed for both sides of the mill box.

Figure 2:
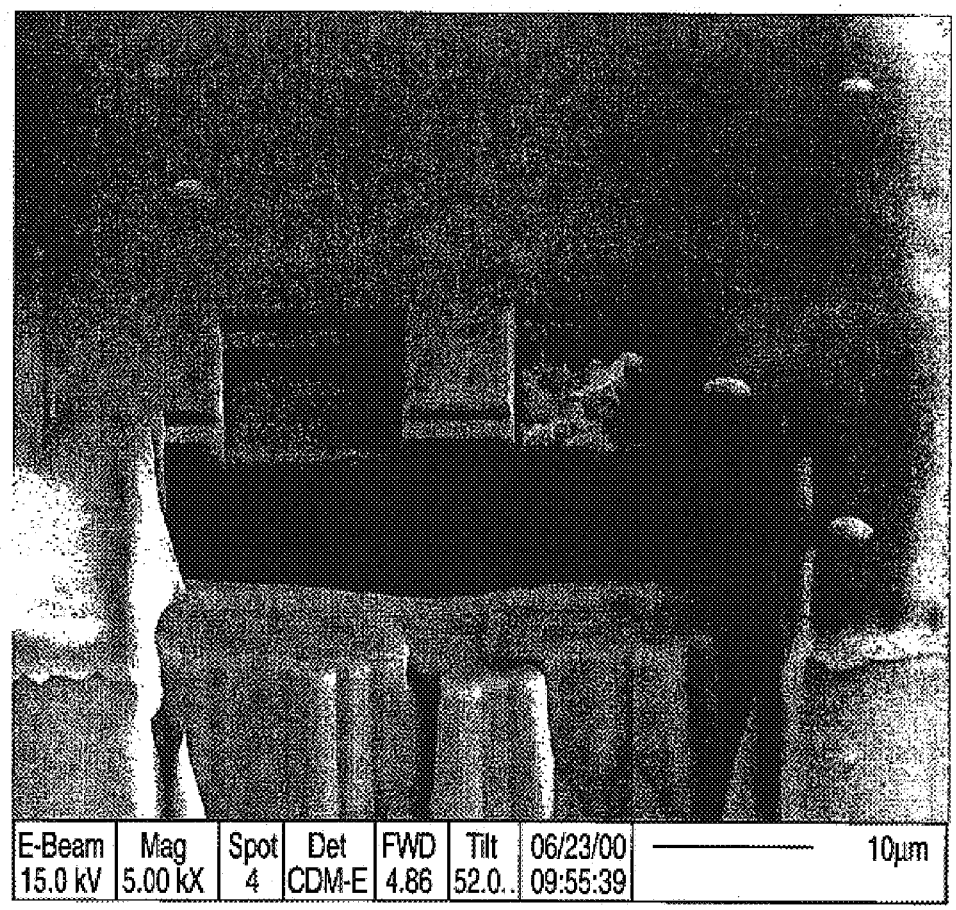
FIG. 2 is a scanning electron micrograph of a mill box, wherein the left side of the mill box is processed in accordance with an embodiment of the present invention and the right side of the mill box is processed in accordance with the prior art.

As show in the scanning electron micrographs of FIG. 2, the default FIB milling process applied to both the TEOS and copper layers resulted in a grain dependence and redeposition of copper onto the substrate (right hand side of mill box). In contrast, the FIB milling process employing iodine gas assisted etching for removal of the copper layer resulted in clean removal of the copper with no observed grains or redeposition of copper. Moreover, the process did not result in any corrosion of the exposed copper.

While preferred embodiments have been shown and described, various modifications and substitutions maybe made thereto by one skilled in the art without departing from the spirit and scope of the invention. Accordingly, it is understood that the present invention has been described by way of illustration only, and such illustrations and embodiments as have been disclosed herein are not to be construed as limiting the scope of the claims.

What is claimed is:

1. A process for milling copper metal from a substrate having an exposed copper surface, the process comprising:

absorbing a halogen gas onto the exposed copper surface to generate reaction products of copper and the halogen gas;

removing unreacted halogen gas from the surface by scanning the surface with an electron beam; and directing a focused ion beam onto the surface to selectively remove a portion of the surface comprising the reaction products.

2. The process according to claim 1, wherein the halogen gas consists essentially of iodine.

3. The process according to claim 1, wherein the halogen gas is selected from the group consisting of chlorine, fluorine, iodine and mixtures thereof.

4. The process according to claim 1, wherein the focused ion beam current comprises an energy from about 500 to 3,000 picoAmps.

5. A process for focused ion beam milling multiple layers of a substrate, wherein the substrate comprises an insulating layer in contact with an underlying copper surface, the process comprising:

exposing the substrate to a noble gas halide within an enclosed chamber;

directing a focused ion beam onto a portion of the insulating layer and removing the portion to expose the underlying copper surface;

absorbing a halogen gas onto the exposed copper surface to generate reaction products of copper and the halogen gas;

removing unreacted halogen gas from the surface by scanning the surface with an electron beam at an energy effective for removing the unreacted halogen from the surface; and directing a focused ion beam onto the surface to selectively remove a portion of the surface comprising the reaction products.

6. The process according to claim 5 wherein the halogen gas consists essentially of iodine.

7. The process according to claim 5, wherein the noble gas halide is selected from the group consisting of $XeF_2$, $XeF_4$, $XeF_6$, $KrF_2$, $KrF_4$ and $KrF_6$.

8. The process according to claim 5, wherein the halogen gas is selected from the group consisting of chlorine, fluorine, iodine and mixtures thereof.

9. The process according to claim 5, wherein the focused ion beam comprises gallium ions.

10. The process according to claim 5, wherein the beam current comprises an energy from about 500 to 3,000 picoAmps.

11. The process according to claim 1, wherein absorbing the halogen gas comprises forming at least a saturated monolayer of the halogen gas onto the surface.

* * * * *

UNITED STATES PATENT AND TRADEMARK OFFICE
CERTIFICATE OF CORRECTION

PATENT NO. : 6,730,237 B2
DATED : May 4, 2004
INVENTOR(S) : Michael R. Sievers

It is certified that error appears in the above-identified patent and that said Letters Patent is hereby corrected as shown below:

<u>Title page,</u>
Item [*] Notice, delete the phrase "by 13 days" and insert -- by 133 days --

Signed and Sealed this

First Day of March, 2005

JON W. DUDAS
*Director of the United States Patent and Trademark Office*